United States Patent
Lee et al.

(10) Patent No.: US 7,079,085 B2
(45) Date of Patent: Jul. 18, 2006

(54) ANTENNA STRUCTURE FOR INDUCTIVELY COUPLED PLASMA GENERATOR

(75) Inventors: Young-Kwan Lee, Daejeon (KR); Sang-Won Lee, Daejeon (KR); Sae-Hoon Uhm, Seoul (KR)

(73) Assignee: Plasmart Co. Ltd. (KR)

( * ) Notice: Subject to any disclaimer, the term of this patent is extended or adjusted under 35 U.S.C. 154(b) by 234 days.

(21) Appl. No.: 10/766,665

(22) Filed: Jan. 27, 2004

(65) Prior Publication Data

US 2004/0223579 A1 Nov. 11, 2004

Related U.S. Application Data

(63) Continuation of application No. PCT/KR02/01407, filed on Jul. 26, 2002.

(51) Int. Cl.
  *H01Q 21/00* (2006.01)
  *H01Q 11/12* (2006.01)
  *H01J 7/24* (2006.01)

(52) U.S. Cl. .................. 343/867; 343/742; 315/111.21
(58) Field of Classification Search ............... 343/867, 343/742; 118/723; 315/111.51, 111, 111.21; 216/79, 67
See application file for complete search history.

(56) References Cited

U.S. PATENT DOCUMENTS

| | | | | |
|---|---|---|---|---|
| 5,289,509 A | | 2/1994 | Moeller | 376/123 |
| 5,952,978 A | * | 9/1999 | VanVoorhies | 343/742 |
| 6,297,595 B1 | * | 10/2001 | Stimson et al. | 315/111.51 |
| 6,350,347 B1 | * | 2/2002 | Ishii et al. | 156/345.48 |
| 6,436,304 B1 | * | 8/2002 | Nogami | 216/79 |
| 6,463,875 B1 | * | 10/2002 | Chen et al. | 118/723 I |
| 6,842,147 B1 | * | 1/2005 | Howald et al. | 343/701 |
| 2002/0018025 A1 | * | 2/2002 | Matsuda et al. | 343/895 |
| 2003/0189524 A1 | * | 10/2003 | Wilcoxson et al. | 343/742 |
| 2003/0201722 A1 | * | 10/2003 | Appleyard | 315/111.21 |
| 2003/0234744 A1 | * | 12/2003 | Podger | 343/742 |

FOREIGN PATENT DOCUMENTS

| | | |
|---|---|---|
| EP | 1 079 671 | 2/2001 |
| JP | 2002-048998 | 2/2000 |
| JP | 2000-323298 | 11/2000 |

* cited by examiner

*Primary Examiner*—Don Wong
*Assistant Examiner*—Tung Le
(74) *Attorney, Agent, or Firm*—St. Onge Steward Johnston & Reens LLC

(57) ABSTRACT

An antenna structure for an inductively coupled plasma generator suitable for processing large-diameter wafers or large, flat-panel display devices by making a plasma density distribution uniform and symmetrical with respect to a rotating direction inside a circular or rectangular chamber in which a wafer is processed. In the antenna structure having a powered end to which RF power is applied and a ground end connected to the ground, at least two loop antenna elements are disposed electrically in parallel with each other, the powered ends and ground ends of the respective antennas are disposed symmetrically with respect to the center of the antennas, and the antennas crossing each other such that the powered ends and ground ends thereof are disposed at a part far from a chamber and central parts thereof are disposed at a part close to the chamber.

11 Claims, 9 Drawing Sheets

[FIG. 1]
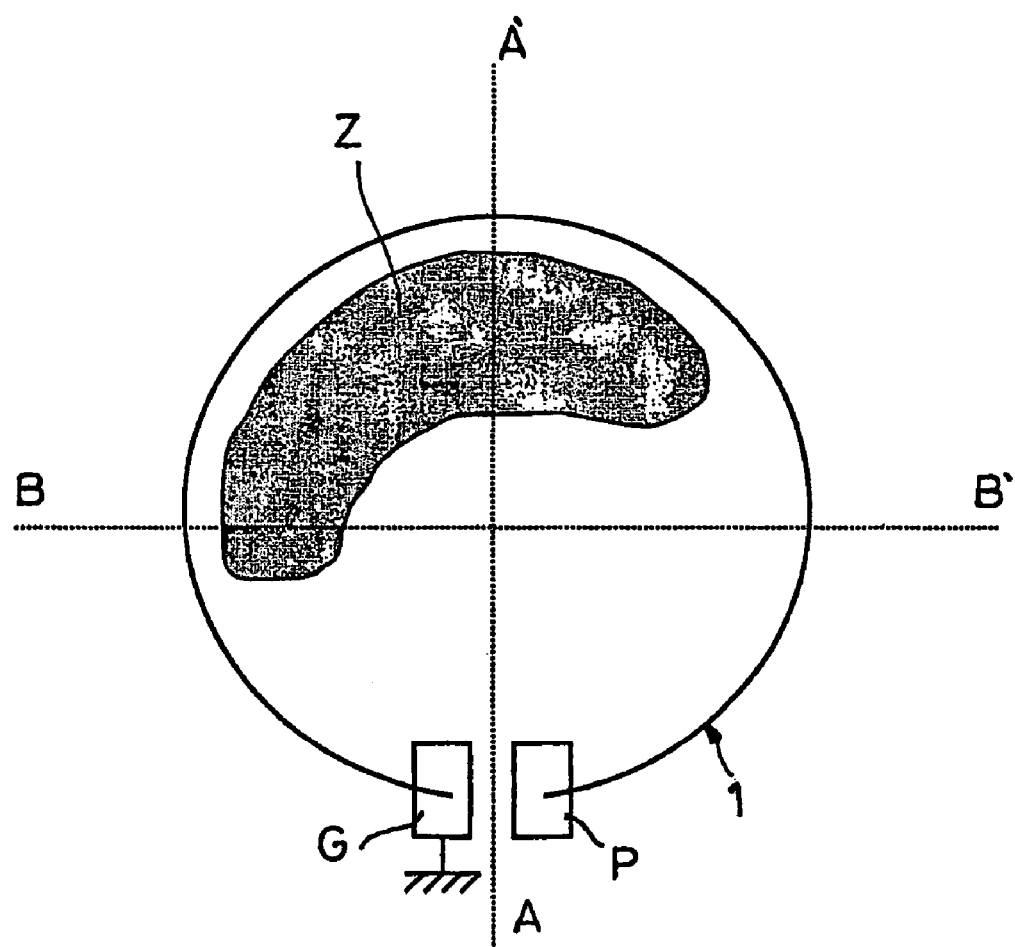

[FIG. 2]
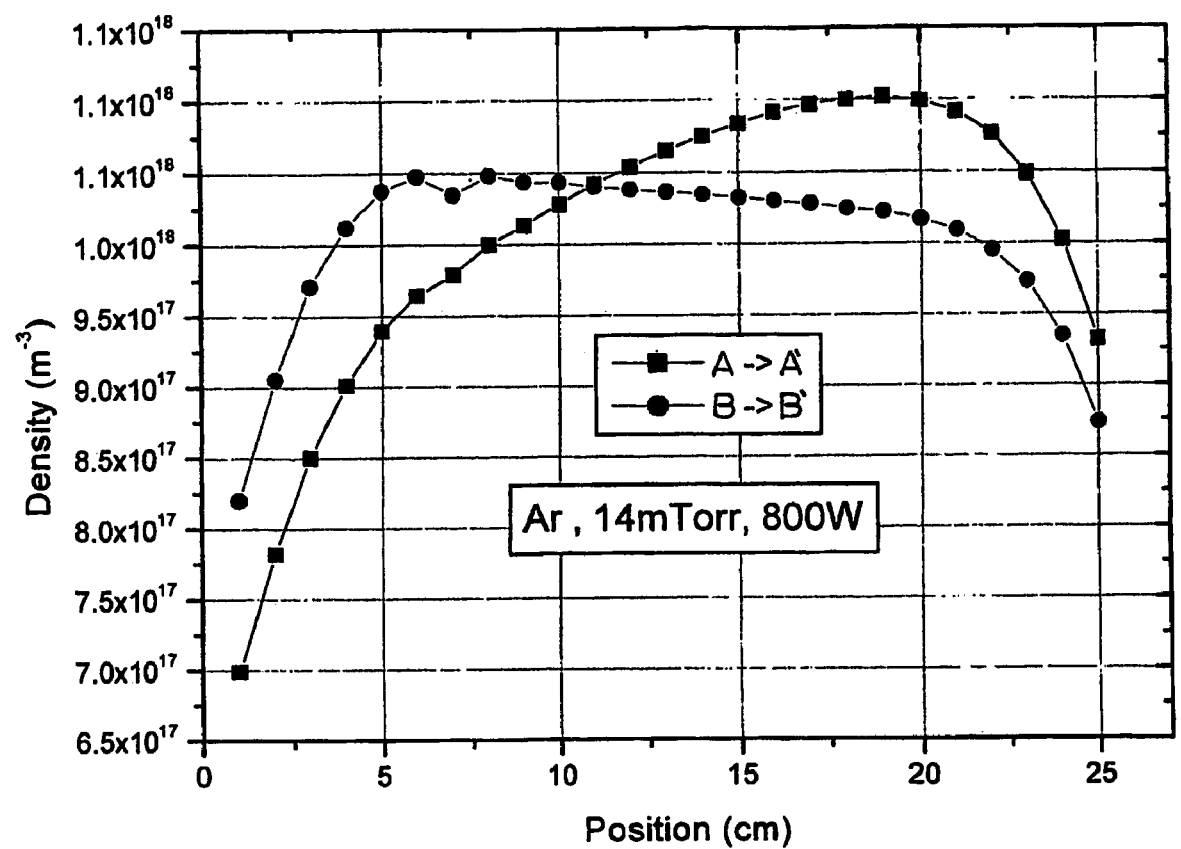

[FIG. 3]
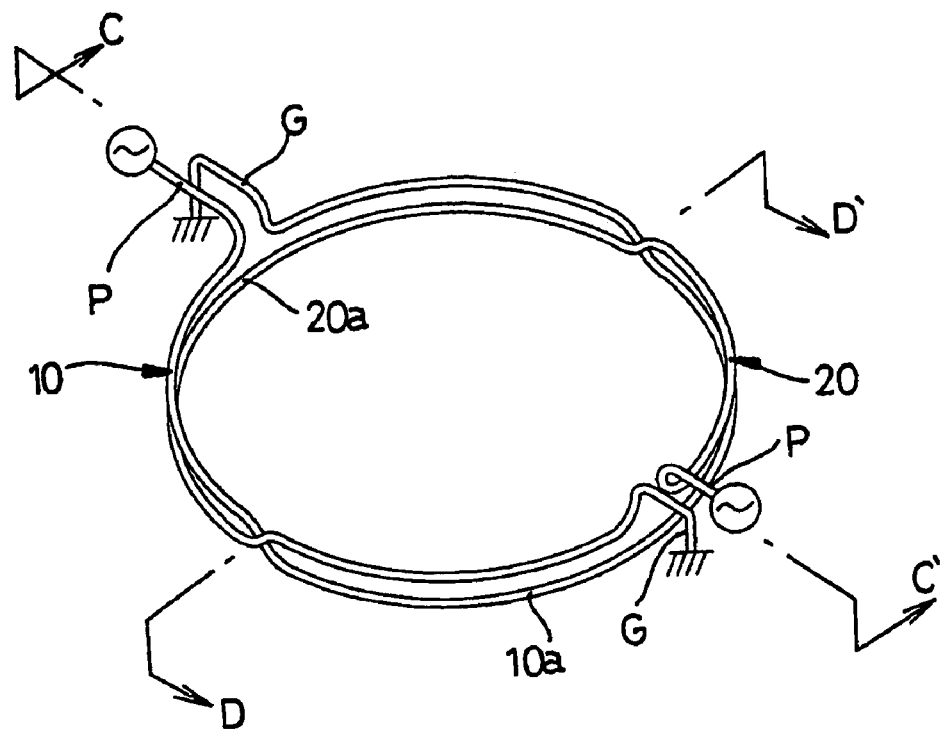
[FIG. 4]
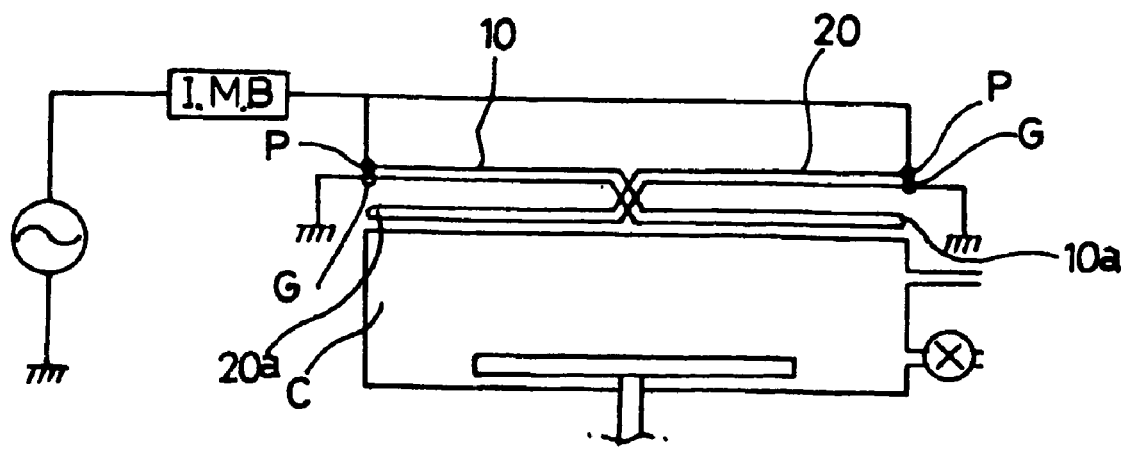

[FIG. 5]
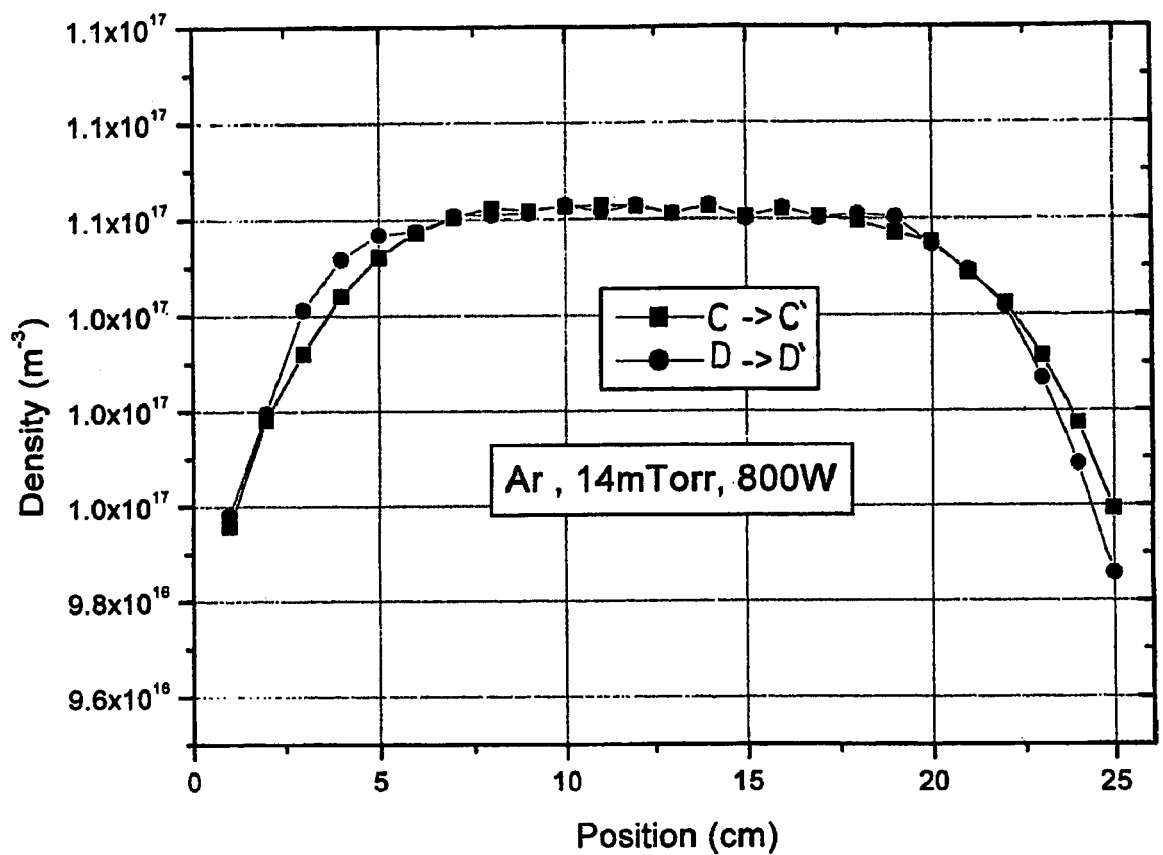

[FIG. 6]
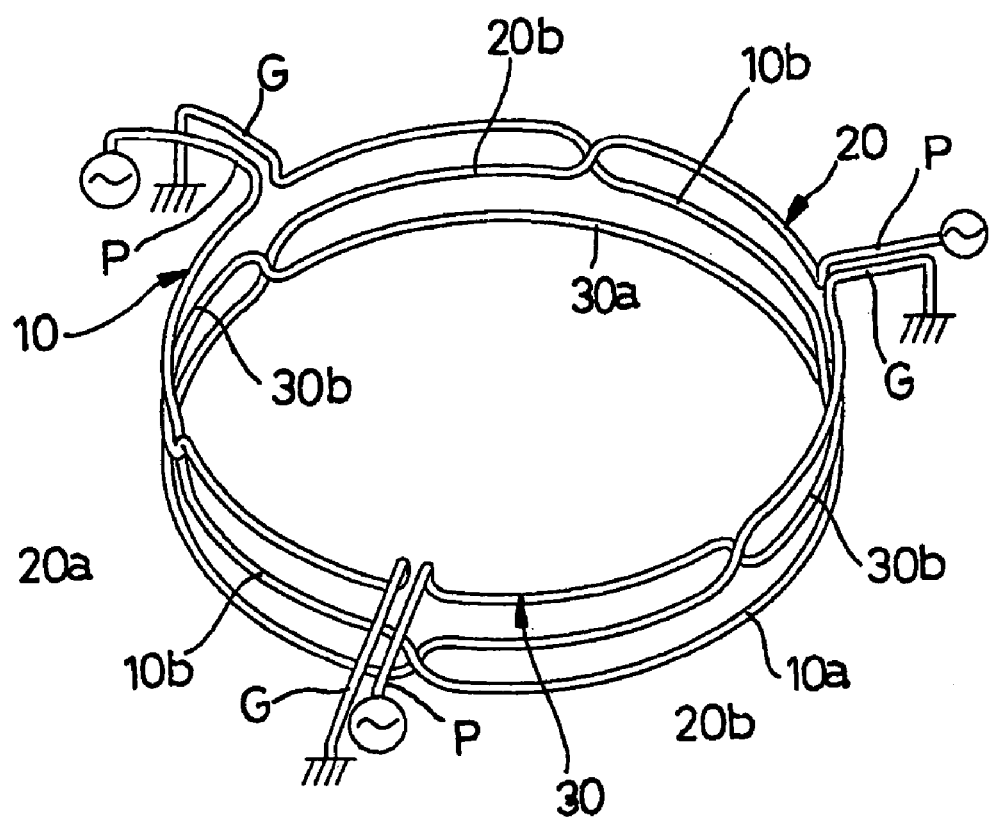

【FIG. 7】
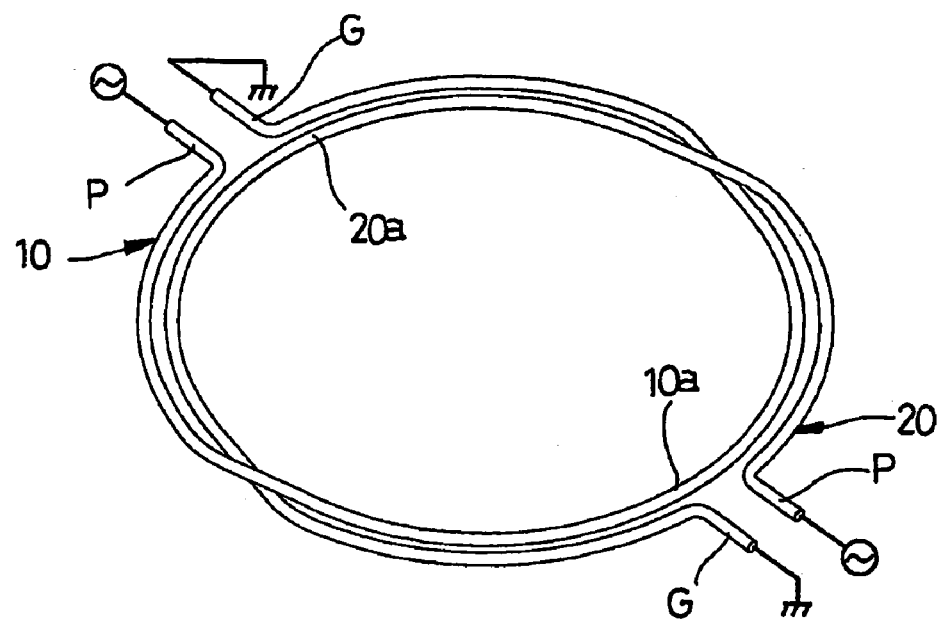
【FIG. 8】
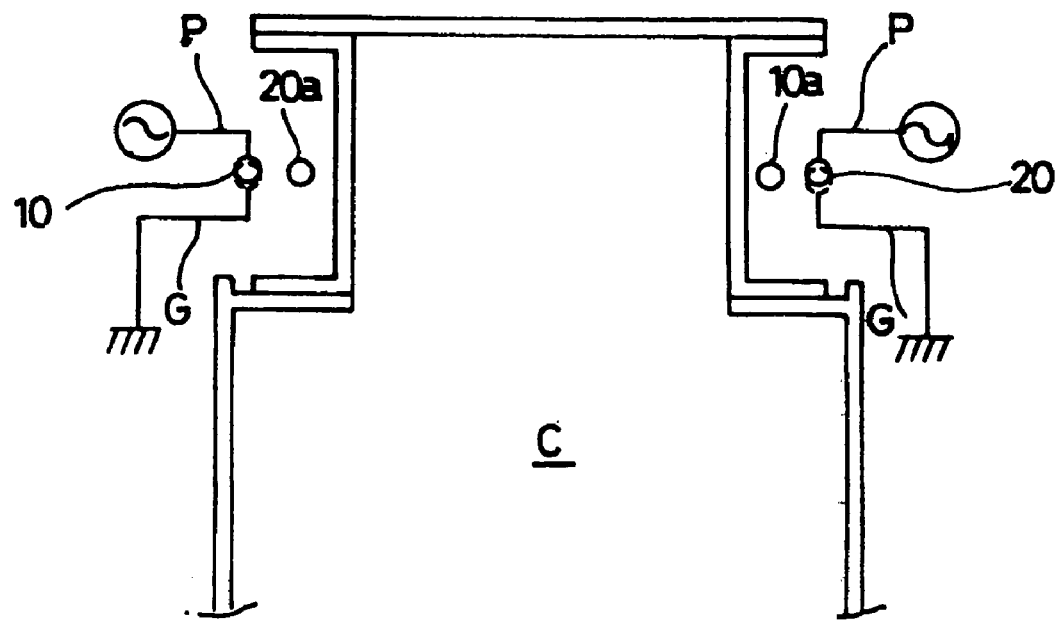

【FIG. 9】
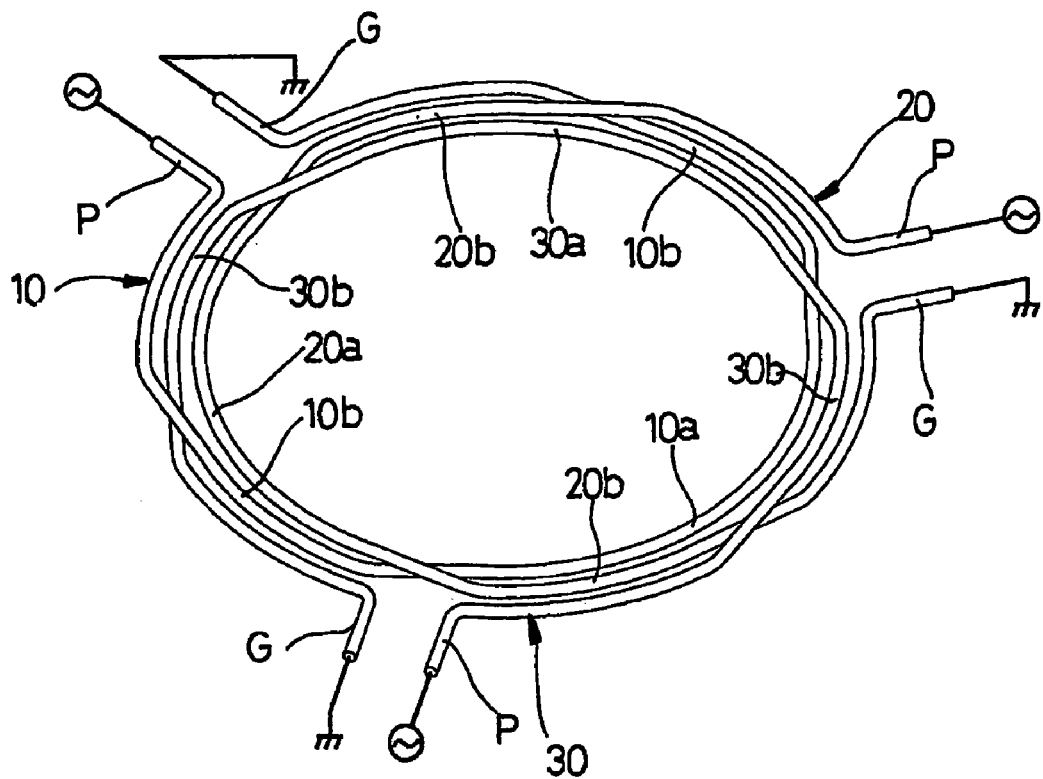
【FIG. 10】
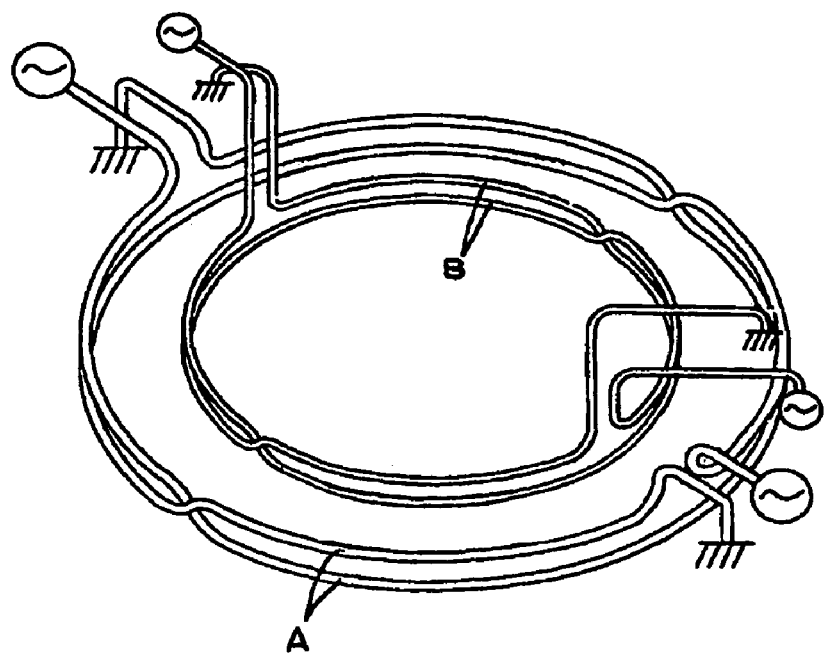

[FIG. 11]
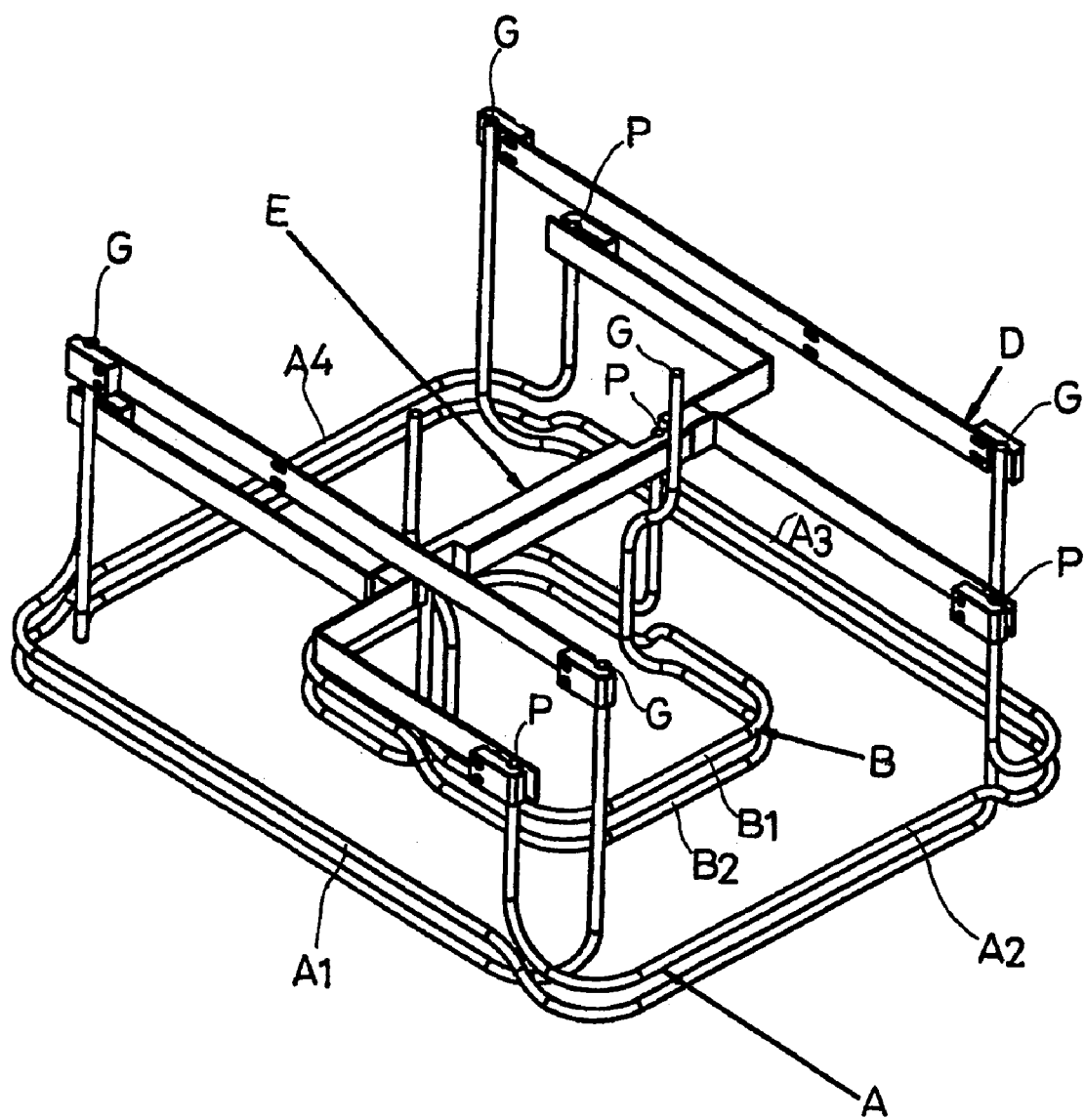

[FIG. 12]
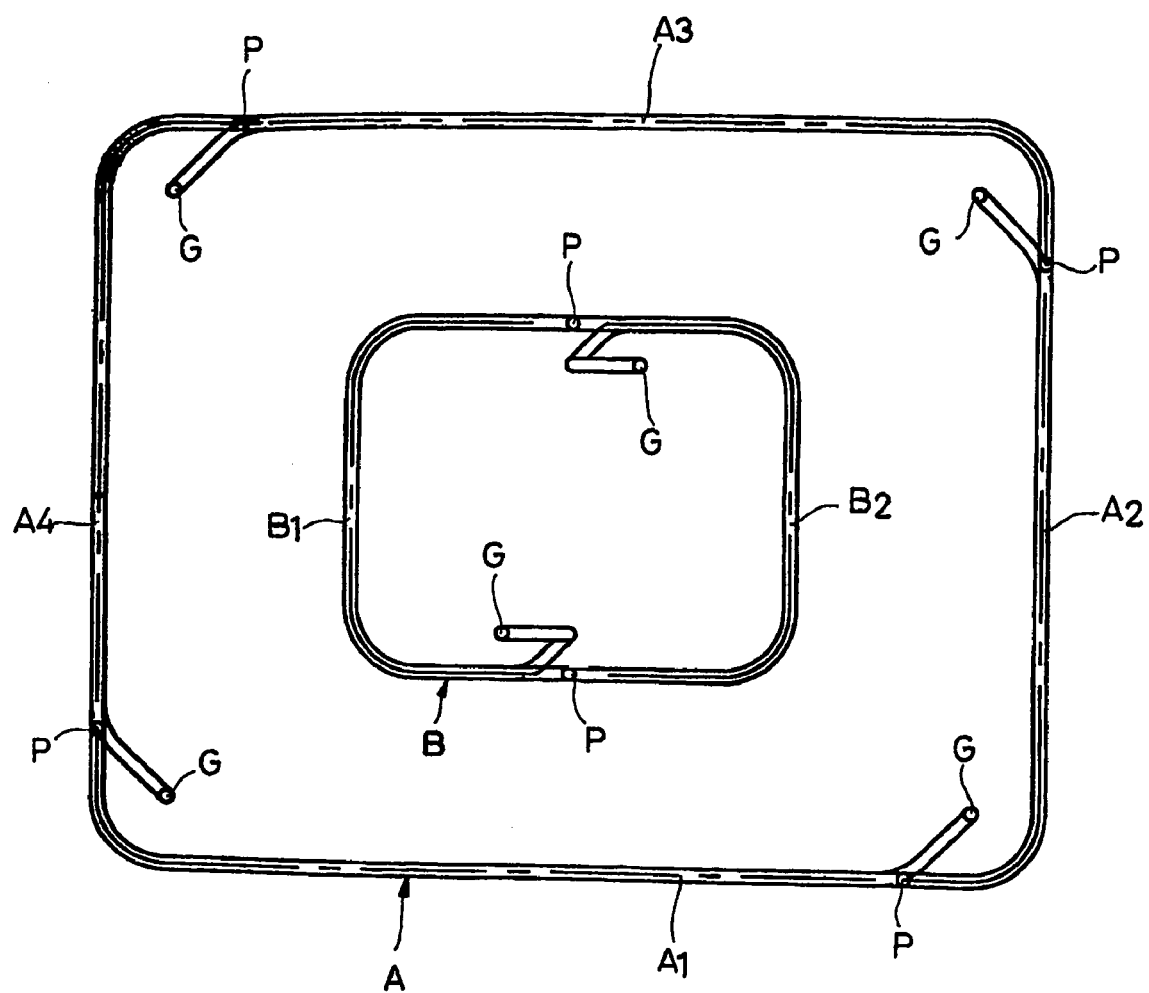

ANTENNA STRUCTURE FOR INDUCTIVELY COUPLED PLASMA GENERATOR

This application is a continuation of pending International Patent Application No. PCT/KR02/01407 filed Jul. 26, 2002 which designates the United States and claims priority of pending Korean Application No. 2001-23128 filed Jul. 30, 2001.

FIELD OF INVENTION

The present invention relates to an antenna structure for an inductively coupled plasma generator. More particularly, the present invention relates to an inductively coupled plasma generator in which impedance is reduced by using parallel antennas so as to uniformly adjust nonuniform plasma distribution density, which is due to high voltage application and nonuniformity in voltage throughout the antenna structure, the antennas being symmetrically installed and intersecting at their central parts where powered ends and ground ends thereof are disposed in parallel with each other, so that plasma is generated inside a chamber to be uniformly and symmetrically distributed with respect to a rotating direction.

BACKGROUND OF INVENTION

In order to produce a fine pattern on a substrate like a semiconductor wafer, flat panel display or the like in a technical field of fabricating a semiconductor device, plasma is generated to perform a variety of surface treatment processes including dry etching process, chemical vapor deposition process, sputtering and the like. In order to reduce cost and improve throughput, the size of a semiconductor wafer and that of a substrate for a flat panel display has shown a tendency of getting larger, for instance, over 300 mm in recent years. Accordingly, a device for generating plasma to process such a large wafer or substrate gets larger.

Widely used types of plasma generators include an inductively coupled plasma generator, a capacitively coupled plasma generator and the like. In addition, there has been proposed a method in which a magnetic field is applied to a general plasma generator.

Even if an inductively coupled generator is advantageous in obtaining high density plasma, it requires many additional elements for achieving a uniform density distribution. For example, a dielectric element having a central part thicker than the other parts, or a dome-shaped antenna, is used, which is, however, complex and difficult to be applied to an etching process of oxide.

The above-described inductively coupled plasma generator includes a chamber in which plasma is generated. The chamber includes a gas inlet opening for supplying reactant gas, a vacuum pump for keeping the internal part of the chamber in a vacuum state and a gas outlet opening for exhausting reactant gas after reaction. In addition, there is a chuck on which a specimen such as a wafer, glass substrate or the like will be placed in the chamber. An antenna connected with a high frequency power source is installed on the chamber. An insulating plate is installed between the antenna and the chamber for decreasing capacitive coupling characteristics, which helps transmission of energy from the high frequency power source to plasma through the inductive coupling.

The plasma generator thus constructed operates as follows. In other words, all the air filling in the internal part of the chamber is discharged out with a vacuum pump to get to a vacuum state at the first step. A reactant gas is infused for generating plasma through the gas inlet opening, and the chamber is kept at a necessary level of gas pressure. Then, the high frequency power is applied to the antenna device from the high frequency power source.

The conventional plasma generator is constructed with a spiral shaped antenna or a plurality of divided electrode type antennas. Therefore, with radio frequency (RF) power, a vertical magnetic field is formed along with changes of time at a plane horizontal to the antenna. The magnetic field that changes in time as such forms an inductive electric field at the internal part of the chamber. When electrons are heated and induced to an electric field to thereby generate plasma inductively coupled with the antenna. As described above, electrons are collided with neighboring neutral gas particles to generate ions and radicals and the like which will be used for plasma etching and deposition processes. In addition, if power is applied to the chuck from a separate high frequency power source, it is possible to adjust the energy of ions, which will be applied to the specimen.

A number of wires to form a spiral shaped antenna are connected in series, keeping flow of current constant in each wire. In this case, it is difficult to control distribution of inductive electric fields, and ions and electrons are lost at the internal wall of the chamber. Therefore, a high density of plasma is formed at the central part of the plasma, but a low density of plasma is formed at the part close to the internal wall of the chamber. As a result, it is extremely difficult to achieve uniformity in the density distribution of the plasma.

Furthermore, as all the wires of the antenna are connected in series, there may be a great voltage drop, which may increase the influence of a capacitive coupling characteristic with the plasma. Thus, the electrical efficiency of the antenna decreases and it is difficult to keep uniformity in the density distribution of plasma.

Next, in the antenna constructed with three separate electrodes respectively connected with three different phases of high frequency power sources, the density of plasma is generally high, but the density of plasma decreases at a part close to the center of the chamber. It is also difficult to ensure the uniformity in the density distribution of plasma, and it is more difficult to treat a large size of a specimen. In addition, application of separately operated power results in increase in cost because an independent impedance matching circuit should be used for separate electrodes to achieve an impedance matching state for efficient uses of power.

To overcome the above-described problems, the applicant of the present invention proposed an inductively coupled plasma generator in which an external antenna and an internal antenna are independently formed, in Korean Patent Application No. 2000-65696. In the proposed generator, a first inductive coil and a second inductive coil are formed at one end of each of the external and internal antennas, so that the first and second inductive coils establish mutual induction. Thus, if RF power is supplied to the external antenna, power having the same frequency as that supplied to the external antenna is supplied to the internal antenna having the second inductive coil according to the mutual induction of the first and second inductive coils. The power supplied to the internal antenna can be adjusted by controlling the crossing rate of the first and second inductive coils and by axially shifting a ferrite core.

The above-described plasma generator has a problem in that a plasma density distribution inside a chamber is not uniform due to the configuration of a loop antenna. In other words, when viewed from the cross-sectional view of the conventional loop antenna shown in FIG. 1, taken along the lines A–A' and B–B', a relatively high-density zone (Z) is formed at the central part of the antenna 1, and the powered end and ground end of the antenna 1 are relatively low-density zones. Plasma density distributions along the lines A–A' and B–B' are neither symmetrical nor uniform. As described above, a plasma density distribution is asymmetrical with respect to the rotating direction because a relatively high voltage is applied to a powered end of the antenna to cause ionic loss, resulting in a drop in plasma density. Also, since the flow of current at a disconnected portion of the loop antenna, that is, between the powered end and the ground end, is zero, no inductively electric field is generated thereat so that generation of plasma is reduced, resulting in a drop in plasma density.

The conventional antenna also has a problem in that dusty particles are produced in plasma due to a high voltage applied thereto, thereby lowering the yield of semiconductor devices.

SUMMARY OF THE INVENTION

To solve the above-described problems with prior art, the present invention provides a plasma generator with improved antenna structure, which can prevent dusty particles from being generated without applying a high voltage, which can uniformly apply a voltage throughout the antenna structure, and which allows a plasma density distribution to be uniform and symmetrical with respect to a rotating direction inside a chamber, thereby effectively plasma-processing a large-diameter wafer or large-area flat-panel display device.

To accomplish the above object, the present invention provides an antenna structure for an inductively coupled plasma generator, the antenna structure having a powered end to which RF power is applied and a ground end connected to the ground, wherein at least two loop antenna elements are disposed electrically in parallel with each other, the powered ends and ground ends of the respective antennas are disposed symmetrically with respect to the center of the antennas, and the antennas crossing each other such that the powered ends and ground ends thereof are disposed at a part far from a chamber and central parts thereof are disposed at a part close to the chamber.

In the present invention, since the respective antennas are electrically connected in parallel, the overall impedance of the antennas is reduced, thereby solving the problem of nonuniformity in voltage and attaining a uniform voltage distribution with a low voltage applied. Thus, a reduction in yield due to application of a high voltage can be avoided. Also, since parallel antennas are installed at the interior and exterior sides, the antenna installation can be made at a wide area, thereby achieving a large processed area.

In an embodiment of the present invention, the antenna structure is arranged such that the respective antennas installed in a flat chamber cross each other vertically, thereby producing a uniform plasma density distribution in a rotating direction inside the chamber.

In another embodiment of the present invention, there is provided an antenna structure suitable for plasma-processing the surface of a large, rectangular object like a flat-panel display device such as an LCD, PDP or organic EL panel. In the antenna structure, an internal antenna and an external antenna, each being rectangular shaped, are parallel connected to each other. Here, for facilitating inductance matching, the internal antenna is installed such that two rectangular antennas are symmetrically superposed in two-ply loops and the external antenna is installed such that four L-shaped antennas, each having two sides, are symmetrically disposed in two-ply loops. For effectively reducing an electrical field, the respective antenna elements constituting the internal and external antennas are installed such that each powered end is disposed farthest from the chamber and each ground end is disposed near to the chamber, thereby improving plasma uniformity and increasing a useful life of equipment by extending a cleaning cycle by suppressing plasma from being deposited on the internal wall of a dielectric member installed between the antenna structure the chamber.

BRIEF DESCRIPTION OF DRAWINGS

FIG. 1 is a plan view of the antenna structure for a conventional plasma generator;

FIG. 2 is a graphical representation of plasma density distribution along the sectional lines A–A' and B–B';

FIG. 3 is a schematic perspective view of the antenna structure of a plasma generator according to an embodiment of the present invention;

FIG. 4 is a cross-sectional view of an inductively coupled plasma generator with the antenna according to an embodiment of the present invention;

FIG. 5 is a graphic representation corresponding to that shown in FIG. 2, showing the plasma density distribution along the sectional lines C–C' and D–D';

FIG. 6 is a perspective view of an antenna structure according to another embodiment of the present invention;

FIG. 7 is a perspective view of an antenna structure according to still another embodiment of the present invention;

FIG. 8 is a cross-sectional view of an inductively coupled plasma generator with the antenna structure shown in FIG. 7;

FIG. 9 is a perspective view of an antenna structure according to still another embodiment of the present invention;

FIG. 10 is a diagram showing the installation state of the antenna structure according to still another embodiment of the present invention;

FIG. 11 is a perspective view showing an example of the antenna structure according to the present invention configured in a rectangular type to be applied for processing a rectangular, large-area panel, such as a liquid crystal display (LCD) panel, a plasma display panel (PDP) or organic electroluminescent (EL) panel; and FIG. 12 is a plan view of FIG. 11.

DETAILED DESCRIPTION OF EMBODIMENTS

The antenna structure not limiting the present invention will now be described in detail with reference to the accompanying drawings through preferred embodiments.

FIG. 3 is a schematic perspective view of the antenna structure of a plasma generator according to an embodiment of the present invention, and FIG. 4 is a cross-sectional view of an inductively coupled plasma generator with the antenna structure according to an embodiment of the present invention.

As shown in FIGS. 3 and 4, in an antenna structure for an inductively coupled plasma generator according to the present invention, the antenna structure having one end (powered end) to which RF power is applied and the other end (ground end) connected to the ground, at least two loop antenna elements 10 and 20 are disposed in parallel with each other, the powered ends (P) and ground ends (G) of the respective antennas are disposed symmetrically with respect to the center of the antennas 10 and 20, and the antennas 10 and 20 cross each other such that the powered ends (P) and ground ends (G) thereof are parallel to each other, that is, the powered ends (P) and ground ends (G) thereof are disposed at a part far from a chamber C, that is, at an upper part, and central parts 10a and 20a are disposed at a part close to the chamber C, that is, at a lower part.

Since the respective antennas 10 and 20 are electrically connected in parallel, the overall impedance of the antennas is reduced, thereby applying a low voltage thereto.

The crossing range of the respective antennas 10 and 20 is as follows. That is to say, the upper and lower parts of the antennas 10 and 20 cross each other such that the upper part in which the powered ends (P) and ground ends (G) are disposed, and the lower part in which the central parts 10a and 20a are disposed, cross each other halfway to be vertically symmetrical with each other. Thus, a density drop due to ionic loss caused by a high voltage applied to the powered ends (P) can be compensated for using high-density plasma generated at the central parts 10a and 20a of the antennas 10 and 20.

FIG. 5 is a graphic representation showing the plasma density distribution along the sectional lines C–C' and D–D' shown in FIG. 3. Here, a plasma density distribution is measured under the same conditions as those of the conventional plasma generator shown in FIG. 1. The inductively coupled plasma generator with an antenna structure according to this embodiment is configured such that plasma density distribution is spirally symmetrical with respect to the center of the chamber, e.g., along the sectional lines C–C' and D–D'.

In other words, in the present invention, the plasma density distribution is substantially symmetrical left and right with respect to the center along the sectional line C–C', suggesting that the plasma densities at intersections C and C' are substantially uniform. Here, the powered end (P) and ground end (G) of the antenna 10 and the central part 20a of the antenna 20 cross each other at the intersection C, and the powered end (P) and ground end (G) of the antenna 20 and the central part 10a of the antenna 10 cross each other at the intersection C'.

Also, the curves representing the plasma density distribution along the sectional lines C–C' and D–D' substantially coincide with each other, suggesting that the plasma density distribution inside the chamber is symmetrical with respect to a rotating direction.

FIG. 6 is a perspective view of an antenna structure according to another embodiment of the present invention, in which three antennas 10, 20 and 30 are electrically connected in parallel, the powered end (P) and ground end (G) of each of the antennas 10, 20 and 30 are spaced apart from each other at an angular interval of 120° so that upper, middle and lower parts (10, 10b, 10a), (20, 20b, 20a) and (30, 30b, 30a) cross one another in three parallel plies.

The three-ply crossing antenna structure shown in FIG. 6 increases in symmetry with respect to a rotating direction as the number of antennas and the number of crossing increase. According to the present invention, the more the number of antennas and the shorter the crossing interval, the lower the impedance can be obtained. Also, the symmetry with respect to the rotating direction of plasma density becomes more accurate.

FIG. 7 is a perspective view of an antenna structure according to still another embodiment of the present invention, and FIG. 8 is a cross-sectional view of an inductively coupled plasma generator with the antenna structure shown in FIG. 7. The antenna structure according to this embodiment is installed in a cylindrical chamber, in which two antennas 10 and 20 coplanarly cross each other to be disposed at the interior and exterior, respectively, and the circuit thereof is the same as that of the first embodiment of the present invention.

FIG. 9 is a perspective view of an antenna structure according to still another embodiment of the present invention, which is installed in a cylindrical chamber as shown in FIG. 8. Three antennas 10, 20 and 30 cross each other in three plies along the perimeters of three coplanar concentric circles, that is, the outermost circle 10, 20, 30, the intermediate circle 10b, 20b, 30b, and the innermost circle 10a, 20a, 30a, and have the same circuitry as those of the second embodiment.

FIG. 10 is a diagram showing the installation state of the antenna structure according to still another embodiment of the present invention. In this embodiment, parallel antennas A and B (or antennas shown in FIG. 3 or 6) installed across at the outer and inner parts of a flat dielectric member disposed above a chamber (not shown) are electrically connected to each other in parallel. In order to fabricate a large-diameter semiconductor, parallel antennas are concentrically arranged in two or three plies to make plasma density distributions uniform in a rotational direction and at the inner and outer parts of a large-diameter chamber.

Although an antenna structure for treating the surface of a circular semiconductor wafer has been described above through several embodiments, the invention can also be applied to a plasma generator having an antenna structure suited for plasma-processing a rectangular object used as flat-panel display device, e.g., a liquid crystal display (LCD) panel, plasma display panel (PDP) or organic electroluminescent (EL) panel, the object having a rectangular chamber with a rectangular antenna mounted thereon.

FIGS. 11 and 12 are a perspective view and a schematic plan view showing other examples of the antenna structure according to the present invention, in which rectangular antennas stack each other in two plies.

In the embodiments shown in FIGS. 11 and 12, an internal antenna B and an external antenna A, each being rectangular shaped, are parallel connected to each conductors, that is, a powered end E and a ground jumper D, respectively. Here, for facilitating inductance matching, the internal antenna B is installed such that two rectangular antennas B1 and B2 are symmetrically superposed in two-ply loops and the external antenna A is installed such that four L-shaped antennas A1, A2, A3 and A4, each having two sides, are symmetrically disposed in two-ply loops. For effectively reducing an electrical field, the respective antenna elements B1, B2, A1, A2, A3 and A4 constituting the internal and external antennas B and A are installed such that each powered end P is disposed farthest from the chamber and each ground end G is disposed near to the chamber, thereby improving plasma uniformity and increasing a useful life of equipment by extending a cleaning cycle by suppressing plasma from being deposited on the internal wall of a dielectric member installed between the antenna structure the chamber.

Since the respective antenna elements B1, B2, A1, A2, A3 and A4 constituting the internal and external antennas B and A are parallel, the inductance sum of the internal antenna B is greater than that of the external antenna A, more current is supplied to the external antenna A having relatively smaller inductance. Thus, plasma density distribution can be uniformly controlled at the outer part and central part of the chamber. The external antenna A has four, substantially L-shaped antennas A1, A2, A3 and A4 crossing each other at each one side, thereby preventing its inductance from unduly increasing. The internal antenna B is disposed such that its powered end and ground end are symmetrical with each other. Therefore, uniformity in plasma generation can be achieved in the rotating direction.

INDUSTRIAL APPLICABILITY

As described above, the antenna structure according to the present invention is configured such that parallel antenna elements are used and the respective antenna elements entirely or partially cross each other, in either a vertical or horizontal manner. According to the present invention, since antenna elements are parallel connected to each other, uniform voltage distribution can be achieved at a relatively low voltage due to reduced impedance. Accordingly, generation of dusty particles due to a high voltage applied, adversely affecting the yield, can be suppressed. Also, inside a circular or rectangular chamber in which a wafer is processed, plasma density distribution can be made symmetrical with respect to a rotating direction without cumbersome voltage adjustment, thereby enhancing plasma generation efficiency. A plasma generator suitable for processing large-diameter wafers or large, flat-panel display devices can be attained.

What is claimed is:

1. An antenna for an inductively coupled plasma generator with a chamber for processing an object received in the chamber with plasma, the antenna comprising:
   a set of at least two loop antenna elements each having a powered end for applying radio frequency power thereto and a ground end for connecting to a ground, each of the loop antenna elements disposed adjacent to one another and in generally parallel relation with one another, each of the loop antenna elements having a lowered portion at a central area between the powered end and the ground end thereof such that the powered end and the ground end of each of the loop antenna elements are disposed at a location far from the chamber of the plasma generator and the lowered portion of each of the loop antenna elements are disposed at a location closer to the chamber.

2. The antenna according to claim 1, wherein each of the loop antenna elements are disposed generally concentrically with one another and having an area crossing another one of the loop antenna elements in a generally vertical direction.

3. The antenna according to claim 1, wherein each of the loop antenna elements are disposed generally concentrically with one another and having an area crossing another one of the loop antenna elements in a generally horizontal direction.

4. The antenna according to claim 1, wherein the powered end and the ground end of each of the loop antenna elements are disposed adjacent to each other.

5. The antenna according to claim 4, wherein the antenna includes two loop antenna elements, and the powered end and the ground end of one of the loop antenna elements are disposed at an angular interval of 180° to the powered end and the ground end of the other one of the loop antenna elements.

6. The antenna according to claim 4, wherein the antenna includes three loop antenna elements, and the powered end and the ground end of one of the loop antenna elements are disposed at an angular interval of 120° to the powered end and the ground end of the others of the loop antenna elements.

7. The antenna according to claim 1, wherein each of the loop antenna elements has a circular shape.

8. The antenna according to claim 7, further including another set of at least two loop antenna elements of circular shape, each loop antenna element of the another set having a lowered portion at a central area between the powered end and the ground end thereof such that the powered end and the ground of each of the loop antenna elements are disposed at a location far from the chamber of the plasma generator and the lowered portion of each of the loop antenna elements are disposed at a location closer to the chamber, the loop antenna elements of the another set having a size smaller than the loop antenna elements of the first set and disposed concentrically within the loop antenna elements of the first set.

9. The antenna according to claim 1, wherein each of the loop antenna elements has a rectangular shape.

10. The antenna according to claim 9, further including another set of at least two loop antenna elements of rectangular shape, each loop antenna element of the another set having a lowered portion at a central area between the powered end and the ground end thereof such that the powered end and the ground of each of the loop antenna elements are disposed at a location far from the chamber of the plasma generator and the lowered portion of each of the loop antenna elements are disposed at a location closer to the chamber, the loop antenna elements of the another set having a size smaller than the loop antenna elements of the first set and disposed concentrically within the loop antenna elements of the first set.

11. An antenna for an inductively coupled plasma generator with a chamber for processing an object received in the chamber with plasma, wherein an internal antenna and an external antenna, each rectangular shaped, are parallel connected to each other, the internal antenna being installed such that two rectangular antenna elements are symmetrically superposed in two-ply loops, and the external antenna being installed such that four L-shaped antenna elements, each having two sides, are symmetrically disposed in two-ply loops, and wherein each powered end is disposed farthest from the chamber and each ground end is disposed near to the chamber.

* * * * *